United States Patent
Yamamoto et al.

(10) Patent No.: US 6,839,236 B2
(45) Date of Patent: Jan. 4, 2005

(54) VOLTAGE CONTROL DEVICE FOR VEHICULAR ALTERNATOR

(75) Inventors: Naoki Yamamoto, Chita-gun (JP); Tooru Ooiwa, Toyota (JP)

(73) Assignee: Denso Corporation, Kariya (JP)

( * ) Notice: Subject to any disclaimer, the term of this patent is extended or adjusted under 35 U.S.C. 154(b) by 163 days.

(21) Appl. No.: 10/315,164

(22) Filed: Dec. 10, 2002

(65) Prior Publication Data

US 2003/0133258 A1 Jul. 17, 2003

(30) Foreign Application Priority Data

Dec. 14, 2001 (JP) ........................................ 2001-381865

(51) Int. Cl.$^7$ ................................................. H05K 7/20
(52) U.S. Cl. ...................... 361/704; 361/719; 165/80.3; 174/16.3; 310/64
(58) Field of Search ................................. 361/690, 694, 361/695, 709, 717–720; 610/64; 165/80.3, 185; 174/16.3

(56) References Cited

U.S. PATENT DOCUMENTS

| | | | | |
|---|---|---|---|---|
| 5,625,229 A | * | 4/1997 | Kojima et al. | 257/712 |
| 6,107,708 A | * | 8/2000 | Yamaguchi et al. | 310/58 |
| 6,282,092 B1 | * | 8/2001 | Okamoto et al. | 361/704 |
| 6,472,772 B2 | * | 10/2002 | Onizuka et al. | 307/10.1 |
| 2002/0021048 A1 | * | 2/2002 | Yamane et al. | 307/10.1 |

FOREIGN PATENT DOCUMENTS

JP     A 8-85402     4/1996

* cited by examiner

Primary Examiner—Boris Chervinsky

(57) ABSTRACT

In an alternator, a voltage control device includes a control circuit IC chip, a radiating fin and a case. The radiating fin 253 has a base 256 that is fixed to the IC chip and radiating portions. The radiating portions protrudes from the base 256 and have substantially U-shaped cross sections, so that tubular air passages are formed between the radiating portions and a fixed surface of the IC chip. Each radiating portion has a central trunk and alternating branches, thereby rows of air passages are formed by the central trunk and rows of branches.

17 Claims, 6 Drawing Sheets

VOLTAGE CONTROL DEVICE FOR VEHICULAR ALTERNATOR

CROSS REFERENCE TO RELATED APPLICATION

This application is based on Japanese Patent Application No. 2001-381865 filed on Dec. 14, 2001, the disclosure of which is incorporated herein by reference.

FIELD OF THE INVENTION

The present invention relates to a voltage control device of a vehicular alternator.

BACKGROUND OF THE INVENTION

A voltage control device of a vehicular alternator generally includes a circuit board on which a control circuit IC chip and a transistor are mounted, a radiating fin joined to the circuit board with a high thermal conductive adhesive and a case forming a male connector. The radiating fin has various shapes in accordance with such as a use environment and a flow of cooling air.

For example, in a voltage control device disclosed in JP-8-85402, a radiating fin includes a plurality of ribbed protrusions. Each protrusion has a straight wall continuous in an airflow direction. The protrusions are arranged parallel in the airflow direction. In the radiating fin, if foreign materials, such as dust and mud, are caught between the ribbed protrusions, air passages are likely to be blocked. This causes cooling performance degradation.

In a case that a radiating fin is made by pressing to improve manufacturability, ribbed protrusions are formed by being cut and raised up from a base wall of the radiating fin. Therefore, apertures are formed on the base wall. When the base wall is bonded to the circuit board, the adhesive is likely to flow through the apertures and make films between the ribbed protrusions by surface tension. As a result, air passages are blocked, thereby lessening cooling capability.

SUMMARY OF THE INVENTION

The present invention is made in view of the above disadvantages, and it is an object of the present invention to provide a voltage control device for a vehicular alternator with an improvement in a cooling capability.

According to the present invention, a voltage control device for a vehicular alternator includes a control circuit, a radiating fin and a case. The control circuit is fixed in the case and sealed with a sealing resin. The radiating fin is joined to the control circuit. The radiating fin has a plurality of ribbed protrusions. Each of the ribbed protrusions is formed discontinuous in an airflow direction.

Accordingly, even if foreign materials are caught and a film of an adhesive is formed in an air passage, the air passage is not completely blocked. Therefore, a cooling capability of the voltage control device improves.

BRIEF DESCRIPTION OF THE DRAWINGS

Other objects, features and advantages of the present invention will become more apparent from the following detailed description made with reference to the accompanying drawings, in which.

DETAILED DESCRIPTION OF PREFERRED EMBODIMENT

A preferred embodiment of the present invention will be described hereinafter with reference to the drawings.

Figure 1:
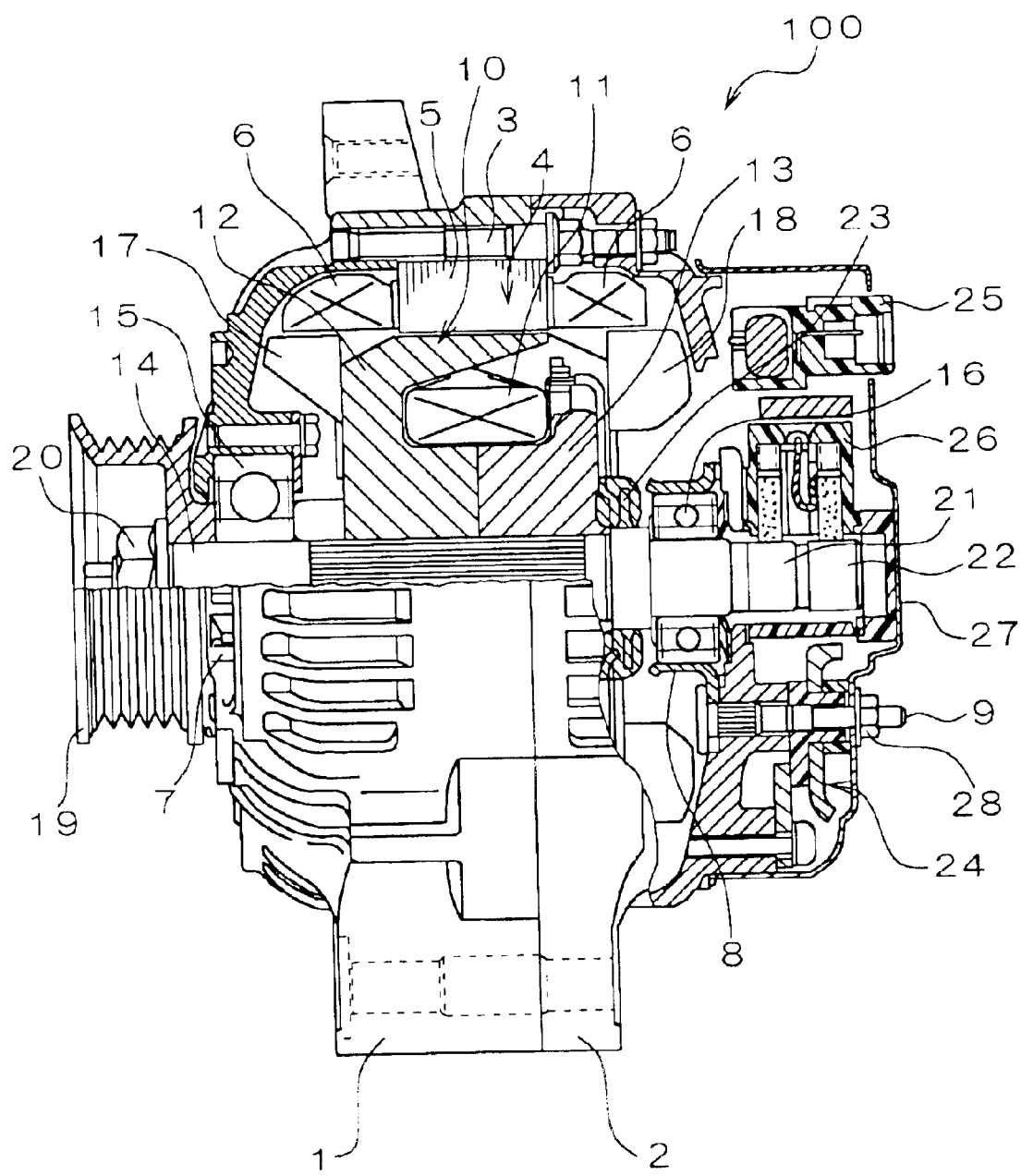
FIG. 1 is a schematic illustration of a vehicular alternator, partially includes cross-section, according to the embodiment of the present invention.

Referring to FIG. 1, a vehicular alternator 100 includes a front frame 1, a rear frame 2, a stator 4, a rotor 10, a rectifier 24, a voltage control device 25, a brush device 26 and a rear cover 27.

The front frame 1 and the rear frame 2 have cup shapes. The front frame 1 and the rear frame 2 are fastened together with bolts 3 in a condition that openings of the front and rear frames 1, 2 are press-contacted to one another. The stator 4 is fixed in the inner periphery of the front frame 1. A cylindrical-shaped bearing box 7 is formed in the front frame 1. A steel bearing box 8 is fastened to the rear frame 2 with a bolt 9 having knurls.

The stator 4 includes a stator core 5 and a stator winding (e.g. three-phase stator windings) 6. The rotor 10 includes a field winding 11, pole cores 12, 13, and a shaft 14. The rotor 10 is rotatably supported by a pair of bearings 15, 16 fixed in the bearing boxes 7, 8. Centrifugal cooling fans 17, 18 are fixed on axial end surfaces of the pole cores 12, 13, respectively. The cooling fan 17, which is fixed on the axial front surface of the pole core 12 (left side in FIG. 1), is a diagonal-flow-type fan having blades that incline toward a rotation direction of the rotor 17 to blow cooling air toward the field winding 11.

A pulley 19 is connected to the front end (left in FIG. 1) of the shaft 14 with a nut 20. The pulley 19 rotates by receiving a driving force from a vehicular engine (not shown). The rear end of the shaft 14 is located outside of the rear frame 2. A pair of slip rings 21, 22 is mounted on the rear end of the shaft 14. The slip rings 21, 22 electrically connect with the field winding 11 through conductors 23.

Electrical components, such as the rectifier 24, voltage control device 25, and brush device 26, are fixed on the axially outside surface of the rear frame 2 by a fixing means such as bolts 9. The rectifier 24 converts an alternating current voltage (e.g. three-phase ac current voltages) generated in the stator windings 6 into dc output voltage. The voltage control device 25 controls an exciting current flowing in the field winding 11 to control an output power of the alternator 100. The brush device 26 is to supply the exciting current into the field winding 11 from the rectifier 24. The brush device 26 includes brushes that are respectively in press-contact with the slip rings 21, 22.

The rear cover 27 is made of a steel plate. The rear cover 27 houses and protects the electrical components including the rectifier 24, voltage control device 25 and brush device 26. The rear cover 27 is fixed by fastening nuts 28 with the bolts 9 projecting from the rear frame 2 such that the rectifier 24 is sandwiched between the rear frame 2 and the rear cover 27. The rear cover 27 forms cooling air intake openings concentrically around the brush device 26.

When the pulley 19 rotates by receiving a rotation force of the engine through a belt, the rotor 10 rotates in a predetermined direction. In this condition, when an exciting voltage is applied to the field winding 11 from the outside, claw poles of the pole cores 12, 13 are respectively magnetized. With this, the three-phase current voltages are generated in the stator windings 6. Thus, a predetermined dc current is output from an output terminal provided in the rectifier 24.

Figure 2:
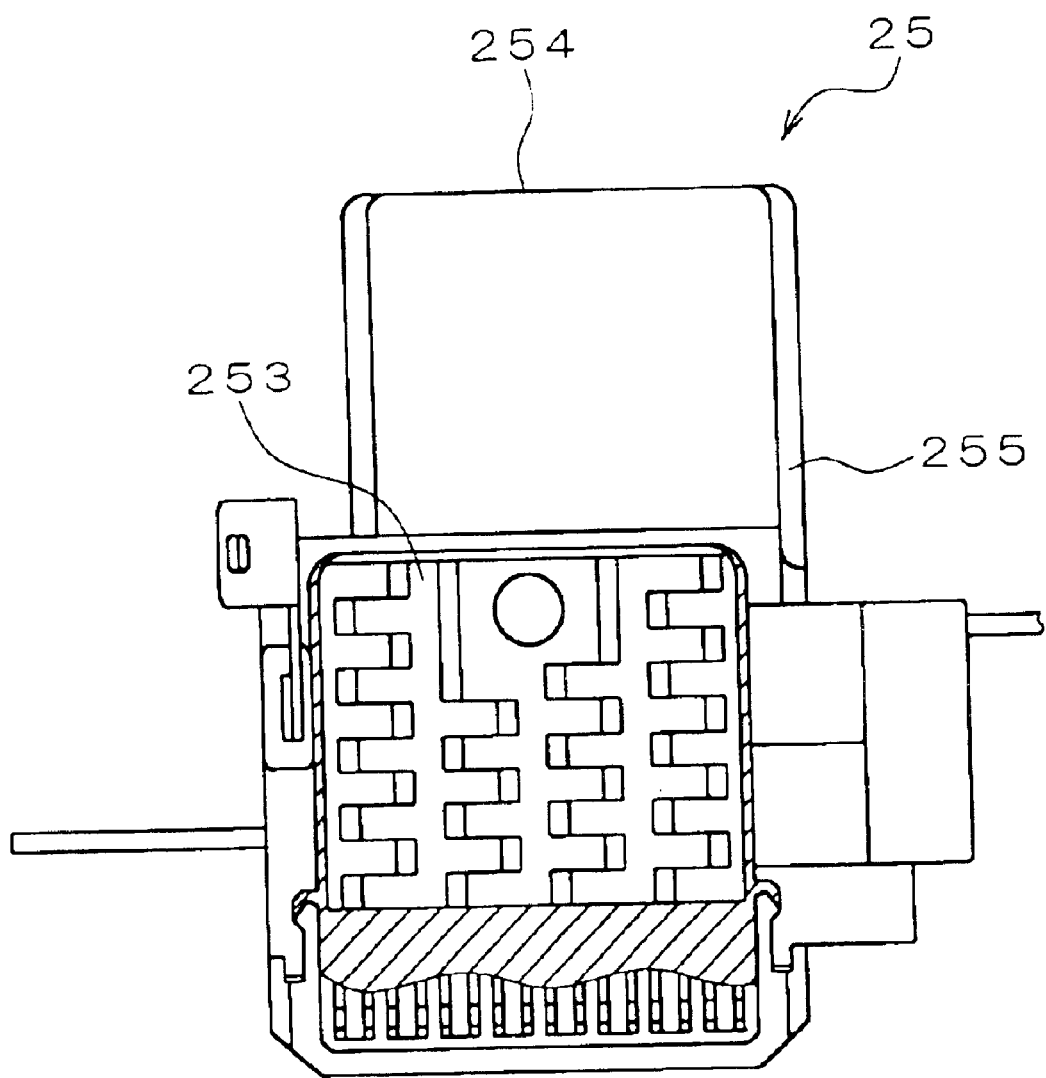
FIG. 2 is a front view of a voltage control device according to the embodiment.
Figure 3:
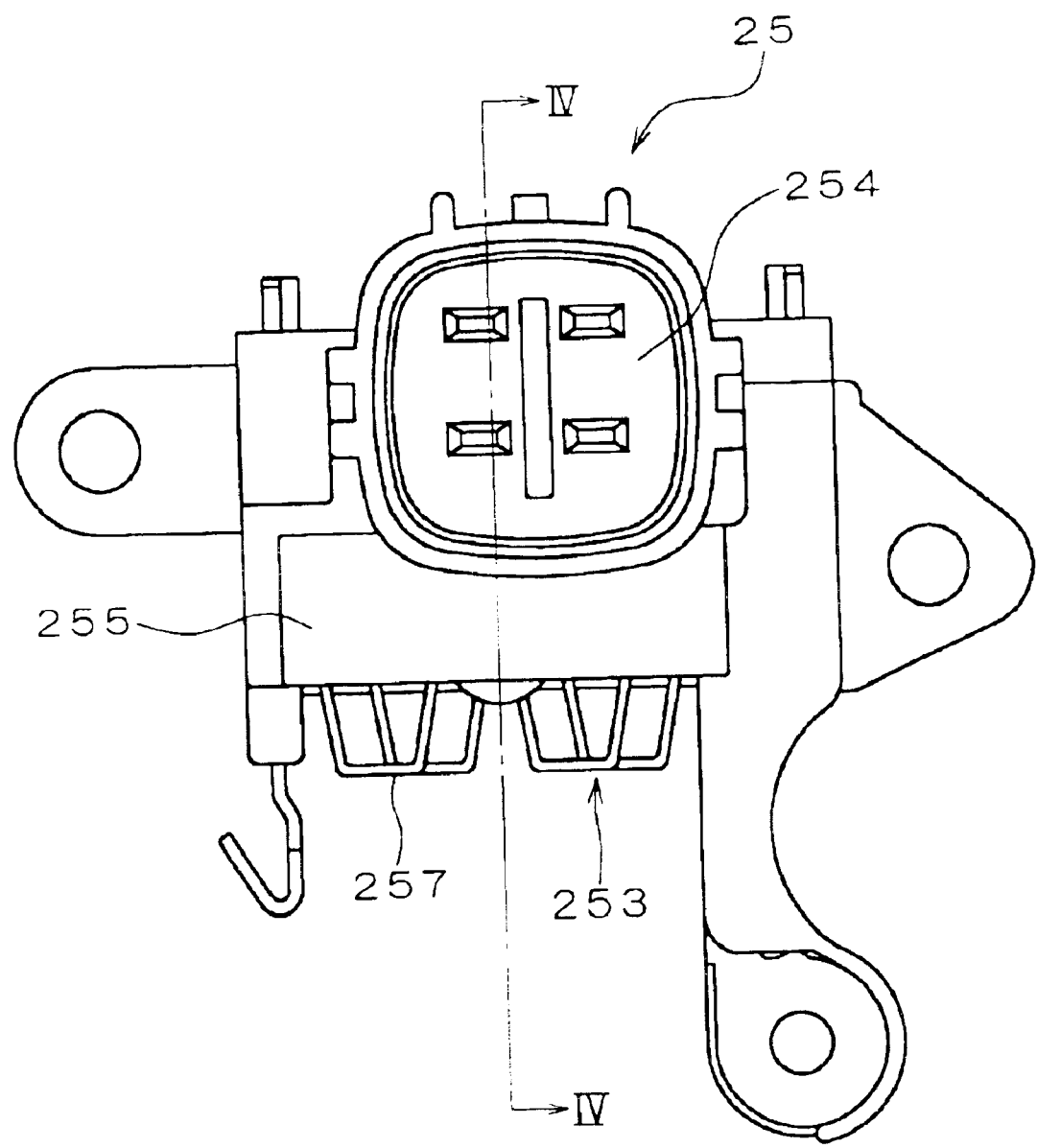
FIG. 3 is a top view of the voltage control device according to the embodiment.
Figure 4:
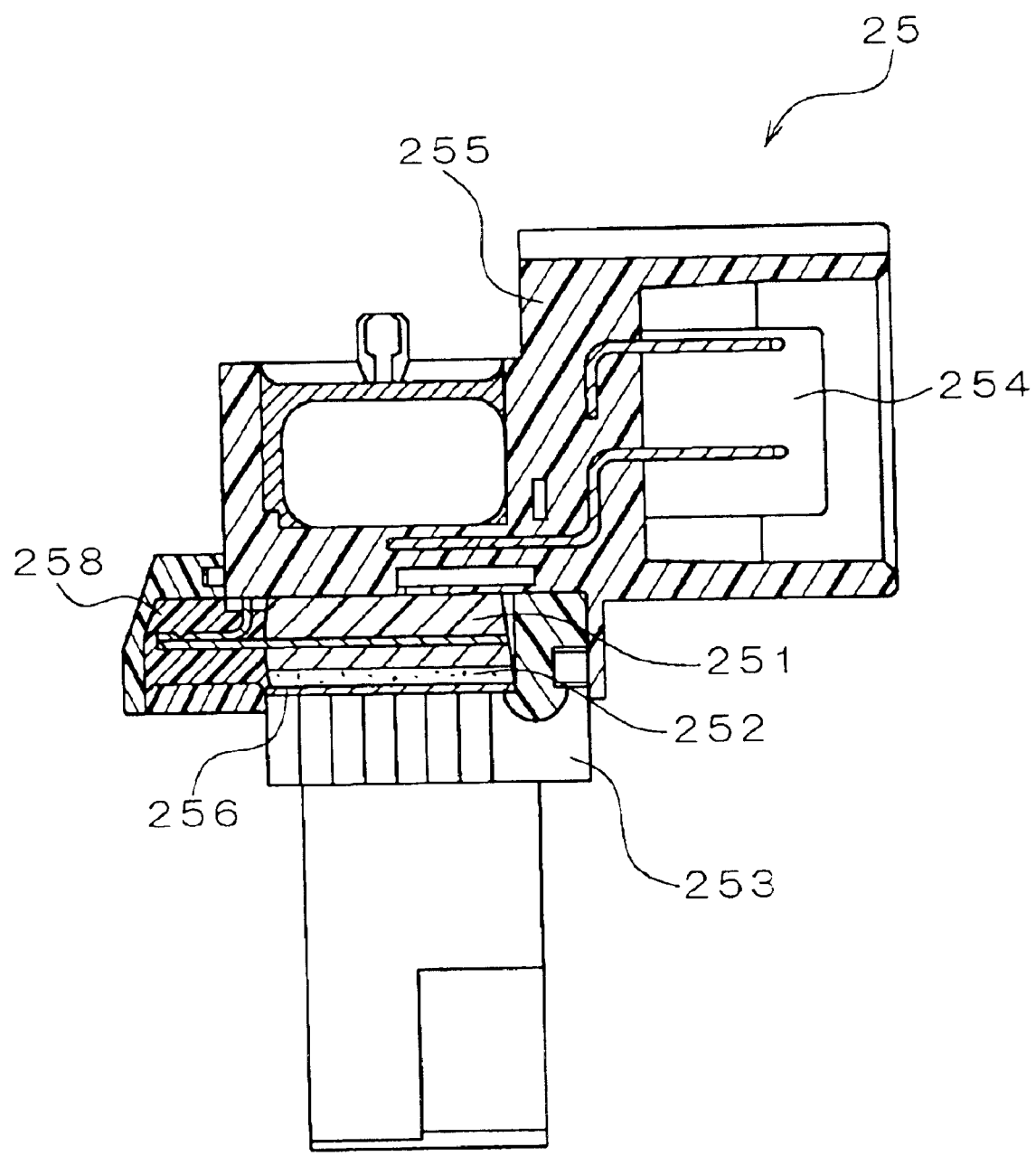
FIG. 4 is a cross-sectional view of the voltage control device taken along a line IV—IV in FIG. 3.

As shown in FIGS. 2 to 4, the voltage control device 25 includes an IC chip (control circuit) 251, a radiating fin 253, and a case 255. The radiating fin 253 is joined to the IC chip 251 with a high thermal conductive adhesive 252. A male connector 254 is formed in the case 255. A circuit for controlling the output power of the alternator 100, various kinds of failure detecting circuits and the like are included in the IC chip 251. The radiating fin 253 has a plurality of ribbed protrusions formed discontinuous in an airflow direction shown by arrows A1 in FIG. 5. The radiating fin 253 is made by pressing a thin aluminum plate. The IC chip 251 is fixed in the case 255 and sealed by a sealing resin 258.

The radiating fin 253 includes a base 256 and heat radiating portions 257. The base 256 is joined to the IC chip 251. The radiating portions 257 are included in the ribbed protrusions. The radiating portions 257 protrude from the base 256 in a direction opposite to the IC chip 251, as shown in FIG. 4. The radiating portions 257 have substantially U-shaped cross-sections when taken perpendicular to the airflow direction. Thus, tubular air passages are formed between the radiating portions 257 and the joining surface of the IC chip 251.

Figure 5:
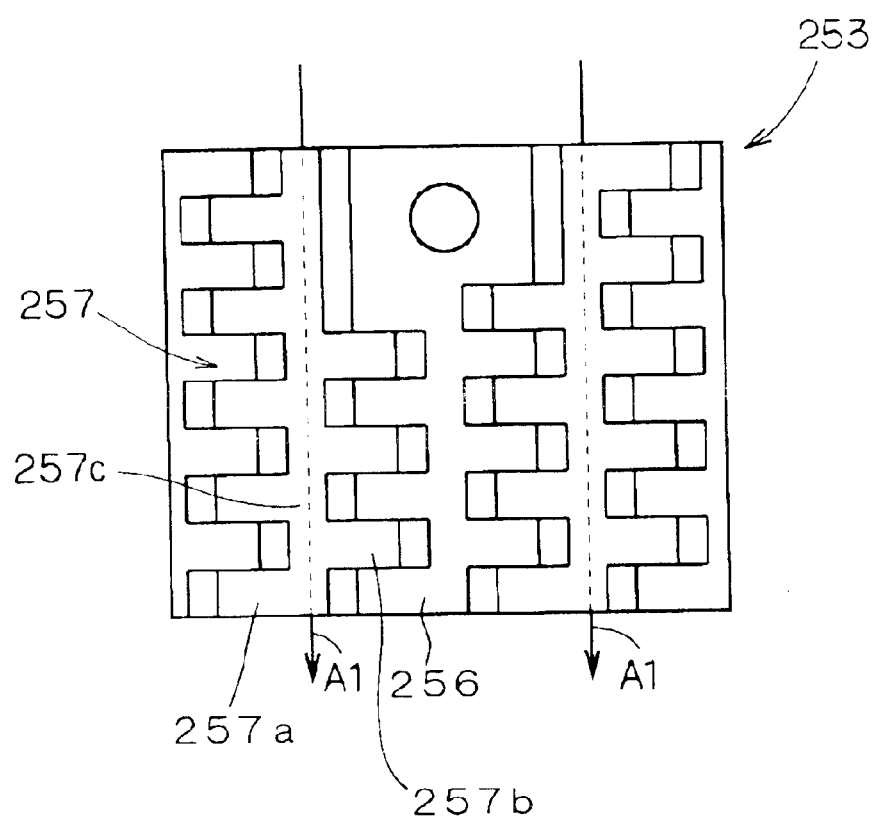
FIG. 5 is a plan view of a radiating fin according to the embodiment.
Figure 6:
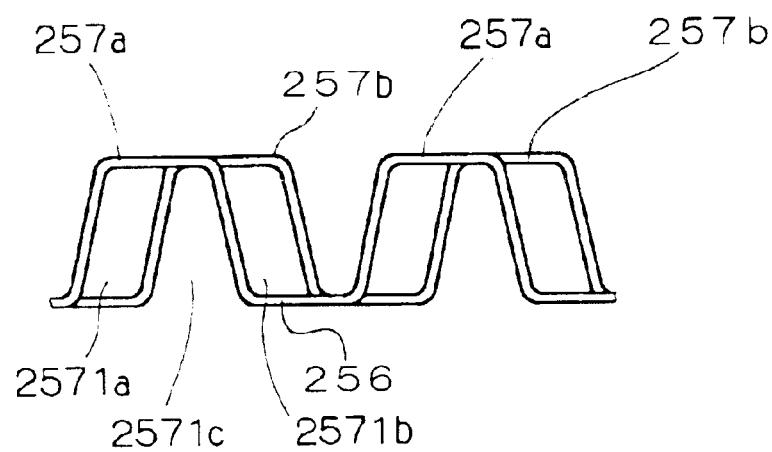
FIG. 6 is an end view of the radiating fin when the radiating fin is viewed along an airflow direction.

Specifically, as shown in FIGS. 5 and 6, each of the radiating portions 257 includes a central trunk 257c extending in the airflow direction A1 and alternating branches 257a, 257b that are substantially perpendicular to the central trunk 257c, so that when the trunk 257c is viewed from an end, three rows of passages are formed, as shown in FIG. 6. The central row 2571c is formed under the central trunk 257c and each of the other two rows 2571a, 2571b is formed under the branches 257a, 257b. Since the branches 257a, 257b are spaced from one another at predetermined intervals in the airflow direction A1, the air passages formed under the rows of branches 257a, 257b are discontinuous in the airflow direction A1.

Since the ribbed protrusions, which define air passages, are formed in discontinuous in the airflow direction, if foreign materials are caught in the air passages or a film of the adhesive is formed in the air passages, the air passages are not completely blocked. Therefore, cooling performance of the voltage control device 25 improves.

Since the radiating portions 257 form tubular air passages, heat radiating surface areas, that is, surface areas contacting with air, increase. Further, the radiating portions 257 restrict the foreign materials to enter the air passages in the protruding direction of the radiating portions 257. Also, the radiating portions 257 are protruded from the base 256 in semi-tubular shape and air passages are formed between the radiating portions 257 and the base 256, heat transmitted from the IC chip 251 to the base 256 is efficiently cooled.

The radiating fin 253 includes a plurality of rows of the radiating portions 257 along the airflow direction. Further, each radiating portion 257 includes the central trunk 257c and rows of the branches 257a, 257b along the airflow direction. With this, heat radiating areas increase. Also, since the central trunk 257c alternately connects the branches 257a, 257b, strength of the radiating portion 257 increases.

Also, since the radiating fin 253 is formed by pressing the thin aluminum plate, manufacturability increases.

Figure 7:
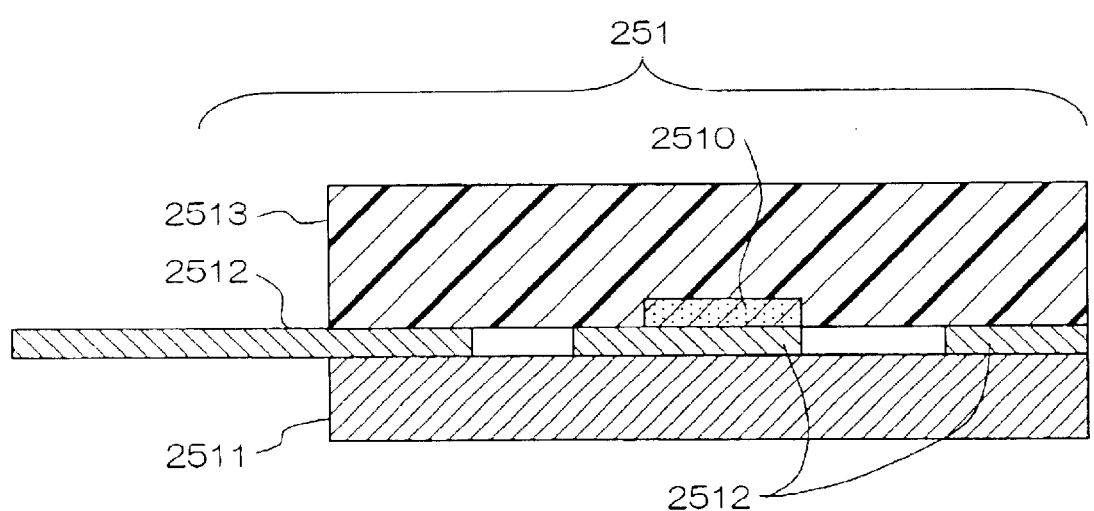
FIG. 7 is a cross-sectional view of a control circuit IC chip according to the embodiment.

As shown in FIG. 7, the IC chip 251 includes an element part 2510, a lead frame 2512, a heat sink 2511 and a resin part 2513. The element part 2510 is made of a silicon semiconductor. The lead frame 2512 constructs a wiring. The element part 2510 is fixed to the lead frame 2512. The lead frame 2512 electrically connects with the element part 2510 at a predetermined position. The heat sink 2511 is made of a high thermal conductive metal. The lead frame 2512 is pressed against and fixed to the heat sink 2511. The resin part 2513 integrates the element part 2510, the heat sink 2511 and lead frame 2512 and protects the element part 2510.

The heat generated by the element part 2510 is transmitted to the heat sink 2511 through the lead frame 2512. Then, the heat is diffused in the heat sink 2511 and transmitted to the radiating fin 253, which is joined to the heat sink 2511 on a side opposite to the element part 2510. Therefore, the heat transmission and radiation improve.

Alternatively, the element part 2510 can be directly joined to the heat sink 2511 such as by soldering, without interposing the lead frame 2512. Since the radiating portion 257 is protruded from the base 256, a contact surface area of the radiating fin 253 with the IC chip 251 is decreased. However, since the element part 2510 is joined to the heat sink 2511, the heat can be transmitted and diffused entirely in the heat sink 2511. Further, the heat can be transmitted to the radiating fin 253 entirely.

In the alternator 100, the voltage control device 25 is located adjacent to the rectifier 24 that is cooled by the cooling air generated by the cooling fan 17, 18. In general, the rotor 10, the stator 4 and the rectifier 24 generate heat greater than that in the IC chip 251. In the radiating fin 253, since the block of the air passages is decreased, even if the cooling air blown to the IC chip 251 is not sufficient, the heat generated in the element part 2510 is effectively radiated by the radiating fin 253 having semi-tubular radiating portions 257.

Further, the radiating fin 253 is preferably arranged such that the airflow direction is in consistent with an axial direction of the shaft 14. That is, a longitudinal direction of the central trunks 257c is in consistent with the axial direction. Therefore, the cooling performance of the radiating fin 253 improves. With this arrangement, the size of the voltage control device 25 can be reduced.

In addition, the radiating fin 253 of the present embodiment increases areas of the radiating portions 257 and the block of the air passages are decreased. Since the radiating fin 253 improves cooling capability, the size of the radiating fin 253 is reduced. Further, the radiating fin 253 is effective to use in a compact alternator having less cooling air passage spaces.

Further, the exciting current control circuit included in the IC chip 251 can be provided by using a MOSFET. Because a primary heat generation is decreased in such the control circuit, the radiating fin 253 can decrease in size.

The present invention should not be limited to the disclosed embodiments, but may be implemented in other ways without departing from the spirit of the invention.

What is claimed is:

1. A voltage control device for a vehicular alternator comprising:

a control circuit;

a radiating fin joined to the control circuit; and a case in which the control circuit is sealed with a sealing resin, wherein the radiating fin includes a plurality of ribbed protrusions protruding in a direction opposite to the control circuit, each of the ribbed protrusions are formed discontinuous in an airflow direction.

2. The voltage control device according to claim 1, wherein the ribbed protrusions have semi-tubular shapes.

3. The voltage control device according to claim 1, wherein the radiating fin has a base joined to the control circuit and radiating portions each having substantially a U-shape cross-section, wherein each of the radiating portions defines a tubular air passage between itself and a surface of the control circuit to which the base is joined.

4. The voltage control device according to claim 3, wherein the radiating portions are arranged in a line along the airflow direction at predetermined intervals.

5. The voltage control device according to claim 4, wherein the radiating portions are alternated in a direction substantially perpendicular to the airflow direction such that a plurality of rows of air passages are formed.

6. The voltage control device according to claim 5, wherein the alternating radiating portions are in contact with one another in the airflow direction.

7. The voltage control device according to claim 1, wherein the radiating fin is formed by pressing an aluminum plate.

8. The voltage control device according to claim 1, wherein the control circuit includes an element part and a heat sink thermally joined to the element part.

9. The voltage control device according to claim 1, wherein the radiating fin and the control circuit are located adjacent to a rectifier of the vehicular alternator, the rectifier being cooled with air generated by a cooling fan of the vehicular alternator.

10. The voltage control device according to claim 1, wherein the radiating fin is arranged such that the airflow direction is in consistent with an axial direction of the vehicular alternator.

11. The voltage control device according to claim 1, wherein the control circuit includes an exciting current control circuit having a MOSFET.

12. A voltage control device for a vehicular alternator comprising:

a control circuit;

a case in which a control circuit is sealed with a sealing resin; and a radiating fin joined to the control circuit, wherein the radiating fin includes a base joined to a surface of the control circuit and a plurality of protrusions that protrude from the base on a side opposite to the control circuit and have substantially U-shaped cross-sections.

13. The voltage control device according to claim 12, wherein each of the protrusions defines a tubular air passage between itself and the surface of the control circuit.

14. The voltage control device according to claim 12, wherein each of the protrusions includes a central trunk and alternating branches that are substantially perpendicular to the central trunk, thereby forming three rows of air passages when viewed from an end of the central trunk.

15. The voltage control device according to claim 12, wherein the control circuit includes an element portion and a heat sink joined to the element portion, wherein the base of the radiating fin is joined to the heat sink on a side opposite to the element part.

16. The voltage control device according to claim 15, wherein the base of the radiating fin is joined to the heat sink with a thermal conductive adhesive.

17. The voltage control device according to claim 14, wherein the radiating fin is arranged such that a longitudinal direction of the central trunk is in consistent with an axial direction of the vehicular alternator.

* * * * *